(12) United States Patent
Pruneri et al.

(10) Patent No.: US 10,775,693 B2
(45) Date of Patent: Sep. 15, 2020

(54) TRANSPARENT AND ELECTRICALLY CONDUCTIVE COATINGS CONTAINING NITRIDES, BORIDES OR CARBIDES

(71) Applicants: FUNDACIÓ INSTITUT DE CIÈNCIES FOTÒNIQUES, Castelldefels, Barcelona (ES); INSTITUCIÓ CATALANA DE RECERCA I ESTUDIS AVANÇATS, Barcelona (ES)

(72) Inventors: Valerio Pruneri, Castelldefels (ES); Rinu Abraham Maniyara, Castelldefels (ES)

(73) Assignees: FUNDACIO INSTITUT DE CIENCIES FOTONIQUES, Castelldefels (Barcelona) (ES); INSTITUCIO CATALANA DE RECERCA I ESTUDIS AVANCATS, Barcelona (ES)

( * ) Notice: Subject to any disclaimer, the term of this patent is extended or adjusted under 35 U.S.C. 154(b) by 262 days.

(21) Appl. No.: 15/722,493

(22) Filed: Oct. 2, 2017

(65) Prior Publication Data
US 2018/0157160 A1 Jun. 7, 2018

Related U.S. Application Data

(63) Continuation-in-part of application No. 15/371,904, filed on Dec. 7, 2016, now abandoned.

(51) Int. Cl.
*G03F 1/24* (2012.01)
*G03F 7/20* (2006.01)
*G03F 1/38* (2012.01)
*G03F 1/22* (2012.01)

(52) U.S. Cl.
CPC .................. *G03F 1/24* (2013.01); *G03F 1/22* (2013.01); *G03F 1/38* (2013.01); *G03F 7/70283* (2013.01)

(58) Field of Classification Search
USPC .................... 428/141, 336, 432, 698; 430/5; 204/192.1; 427/255.28
See application file for complete search history.

(56) References Cited

U.S. PATENT DOCUMENTS

| 6,841,786 B2 | 1/2005 | Kamm |
| 7,678,511 B2 * | 3/2010 | Ikuta ..................... B82Y 10/00 430/5 |
| 2006/0115744 A1 | 6/2006 | Aschke et al. |

(Continued)

FOREIGN PATENT DOCUMENTS

EP 2 581 789 A1 4/2013

OTHER PUBLICATIONS

Liqiang Xu et al., Synthesis, properties and applications of nanoscale nitrides, borides and carbides, Nanoscale, Apr. 2012, 4900-4915.
(Continued)

*Primary Examiner* — Archene A Turner
(74) *Attorney, Agent, or Firm* — Katten Muchin Rosenman LLP

(57) ABSTRACT

The present invention is directed to compositions for photolithographic masks comprising a substrate and a coating having at least one electrical conducting layer comprising a nitride, a boride or a carbide, and methods of making the same.

18 Claims, 4 Drawing Sheets

(56) References Cited

U.S. PATENT DOCUMENTS

| | | | | |
|---|---|---|---|---|
| 2009/0253055 | A1* | 10/2009 | Hayashi | B82Y 10/00 428/141 |
| 2013/0323630 | A1* | 12/2013 | Maeshige | G03F 1/24 430/5 |
| 2014/0295330 | A1* | 10/2014 | Pruneri | G03F 1/146 430/5 |
| 2015/0301442 | A1* | 10/2015 | Kageyama | G03F 1/24 428/141 |
| 2016/0161837 | A1* | 6/2016 | Hamamoto | G03F 7/2004 430/5 |

OTHER PUBLICATIONS

Chuanfang Zhang et al., Transparent, Flexible and Conductive 2D Titanium Carbide (MXene) Films with High Volumetric Capacitance, Advanced Materials 2017, 1702678, pp. 1-9, DOI: 10.1002/adma.201702678.

Elisa Sani et al., Optical Properties of dense zirconium and tantalum diborides for solar thermal absorbers, Renewable Energy, vol. 91 (2016) 340-346, DOI: 10.1016/j.renene.2016.01.068.

E. Ando, S. Suzuki, "Optical and Mechanical Properties of Cr and CrNx Films by dc Magnetron Sputtering", Journal of Non-Crystalline Solids 218 (1997) pp. 68-73, Elsevier Science B.V.

File History from corresponding U.S. Appl. No. 15/371,904.

* cited by examiner

FIG. 3

| No. | Sample | Average Transmission in 400-800 nm (%) | Rs Initial (Ω/Sq.) | Rs after abrasion resistance test (100 Cycle) (Ω/Sq.) | % increase in Rs |
|---|---|---|---|---|---|
| 1 | Cr 20nm – PRIOR ART | 6.71 | 34.6 | 37.2 | 7.51 |
| 2 | Cr 10 nm/ CrN 10nm– PRIOR ART | 19.66 | 107.58 | 101.2 | -5.92 |
| 3 | CrNy 20nm (0.05) | 8.56 | 82.07 | 83.53 | 1.7 |
| 4 | CrNy 20nm (0.15) | 22.4 | 246.2 | 249.7 | 1.4 |
| 5 | CrNy 10nm(0.05)/ CrNy 10nm(0.15) | 11.20 | 110.9 | 112 | 0.9 |
| 6 | CrNy 10nm(0.05)/ CrNy 5nm(0.10)/CrNy 5nm(0.45) | 12.85 | 106.0 | 107.53 | 1.4 |
| 7 | CrNy 5nm(0.05)/ CrNy 5nm(0.10)/CrNy 5nm(0.15)/CrNy 5nm(0.45) | 17.07 | 146.4 | 148.6 | 1.5 |

US 10,775,693 B2

TRANSPARENT AND ELECTRICALLY CONDUCTIVE COATINGS CONTAINING NITRIDES, BORIDES OR CARBIDES

This is a Continuation-In-Part of U.S. patent application Ser. No. 15/371,904, filed Dec. 7, 2016, the entire contents of which are incorporated herein by reference.

FIELD OF THE INVENTION

The present invention relates to the field of optically transparent and electrically conductive coatings on a substrate. In particular semi-transparent backside coatings of lithography masks.

BACKGROUND OF THE INVENTION

As a result of the constantly increasing integration density in the semiconductor industry, photolithographic masks have to project smaller and smaller structures. In order to fulfil this demand, the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. As a consequence, the manufacturing of photolithographic masks with increasing resolution is becoming more and more complex, and thus more and more expensive as well. In order to use significantly smaller wavelengths, lithography systems for the extreme ultraviolet (EUV) wavelength range (approximately 10-16 nm) are presently in development.

Photolithographic masks have to fulfill highest demands with respect to transmission, planarity, pureness and temperature stability. In particular, the surface of reflective masks for EUV radiation coated with the reflective structure has to be plane within the range of about 1 nm in order to avoid aberrations of the desired structure in the photoresist of the wafer. These challenges also apply for other EUV reflective optical elements, as for example mirrors used in the beam path of EUV lithography systems.

The above mentioned challenges require highly precise techniques for the production of the substrates of EUV optical elements. However, even the best production techniques cannot guarantee surface variations below 1 nm. Moreover, the fabrication of mask blanks and/or EUV optical elements from mask blanks may additionally induce further defects in the EUV substrates, and/or thus also in the EUV optical elements. It is therefore necessary to correct defects of EUV optical elements in order to establish an economical production process for these components.

On the other hand, an extremely careful and precise handling and holding of EUV mask blanks and/or EUV optical elements is necessary in order to avoid as far as possible mechanical abrasion and/or the formation of particles from the EUV optical element which may deteriorate the function of an EUV lithography system. Since an EUV optical element is used to expose a large number of semiconductor substrates or wafers, a high effort in terms of production and handling of EUV optical elements is almost always justified.

In order to fulfill these handling requirements, mask EUV blanks are held on an electrostatic chuck during the fabrication of an EUV optical element. Further, EUV masks are also held with an electrostatic chuck in the lithography system during the wafer illumination. As the substrate of EUV optical elements typically comprises a dielectric material or a semiconducting material, an electrically conducting layer has to be deposited on the rear side of a substrate in order to be able to hold the substrate with an electrostatic chuck during the fabrication and/or operation of the optical element. Typically, the electrical sheet resistance (Rs) of such electrically conductive layers has to be lower than several hundreds of $\Omega/\square$, preferably lower than $100\Omega/\square$.

As already mentioned, errors already introduced in the substrate during the substrate production and/or introduced during the fabrication process of the EUV optical element have to be corrected at the end of the production process of the EUV optical element. Moreover, defects may evolve in the course of the operation of an EUV mask in a lithography system.

It is already known that a surface of an EUV optical element can be modified in a controlled manner in order correct planarity and/or placement defects by applying ultrashort laser pulses into the substrate of an optical element (U.S. Pat. No. 6,841,786 B2).

This defect compensation occurs through the rear side of the EUV optical element as the ultra-short laser pulses cannot penetrate the multi-layer structure, which forms the reflective optical element arranged on the front surface of the EUV optical element. Consequently, the electrically conducting layer deposited on the rear side for holding the EUV optical element with an electrostatic chuck has also to be optically transparent for the ultra-short laser pulses.

It is known that nitrides of metals, such as CrN, can be used as backside coating of lithography masks. They are typically used in their stoichiometric composition with a typical bulk resistivity ($\rho$) of 640 $\mu\Omega\cdot$cm. For example, a layer of 100 nm thick provides a surface resistance (Rs) of about $64\Omega/\square$. At these thicknesses such a coating is not transparent. When the thickness is reduced to 25 nm or 5 nm, Rs becomes $256\Omega/\square$ and $1280\Omega/\square$, respectively, while the transparency (T) remains at about 15 and 55%, respectively (FIG. 1). Note that T is an average value for the visible range (400 nm-700 nm) and Rs is calculated from $\rho$ by dividing by the layer thickness (t), i.e. $Rs=\rho/t$.

The trade-off between Rs and T for CrN is such that it cannot meet the typical electrical requirements of lithomask if the coating has to be transparent. Cr has a better trade off as its T is larger for films which have relatively low Rs (FIG. 1). For example, T is easily more than 20% for films with Rs of about $13\Omega/\square$. However, Cr is not as strong as CrN from a mechanical resistance (hardness) point of view, for example against sliding, scratching and abrasive forces. In particular, where optical transmission was not a requirement, CrN is the premium material for back-side coating of lithography masks.

It is known that borides and carbides have similar properties to nitrides (see for example, Synthesis, properties and applications of nanoscale nitrides, borides and carbides by Liqiang Xu et Al. Nanoscale 2012, 4, 4900-4915) i.e. they can be electrically conductive, have high mechanical durability and become transparent when sufficiently thin (Transparent, Flexible and Conductive 2D Titanium Carbide (MXene) Films with High Volumetric Capacitance by Chuanfang Zhang et Al. Advanced Materials 2017, 1702678, DOI: 10.1002/adma.201702678). It is also known that Mo, W, Ti, Zr, Hf, V, Nb, Ta have similar chemical properties to Cr and can form similar nitrides, borides and carbides (Optical Properties of dense zirconium and tantalum diborides for solar thermal absorbers, by Elisa Sani et Al. Renewable Energy, vol. 91 (2016) 340-346).

Where optical transmission, electrical conductivity and mechanical resistance are all requirements, amongst different structures, patent application EP 11185280 proposes to use multi-layered back side coating made of Cr and CrN. Cr allows to achieve sufficiently low Rs and high T while the top CrN layer provides the strong mechanical resistance. However due to the intrinsic mechanical weakness of Cr and the difference in thermal and mechanical properties of the two materials (Cr and CrN), adhesion problems may occur. This is shown in FIG. 3 where it is clear that the Rs value after erasure testing change significantly (more than 6%) for Cr and multilayer Cr/CrN. Ultrathin metal containing structures can be also made with metals similar to Cr, e.g. EP11185280 lists several examples and also metals listed above, and hard compounds different from nitrides, e.g. borades and carbides. However these structures are likely to suffer from the same potential mechanical weakness of Cr/CrN and their applicability depends on the severity of the operating conditions.

As being held on an electrostatic chuck, rear side coatings of EUV optical elements have in addition of being electrically conducting and optically transparent also to fulfil specific mechanical requirements. For example, the pins of an electrostatic chuck or particles may indent in the surface coating on the substrate rear side. Moreover, the rear side coating has to withstand the lateral accelerations occurring during the mask scanning process. For this reason, as already explained in the US 2006/0115744 A1, the coating on the rear side of the substrate of an EUV optical element has to withstand abrasion during the handling of mask blank and/or the EUV optical element with an electrostatic chuck. Further, the electrical conductivity of the rear side coating has to be high enough, so that the mask blank and/or the EUV optical element can securely be handled with an electrostatic chuck. Moreover, the rear side coating has to be optically transparent, so that ultra-short laser pulses with a high optical intensity can be applied through the coating into the substrate of the mask blank and/or the EUV optical element.

By varying the atmosphere during deposition of the Cr atoms on a substrate one can obtain different $CrN_y$ compositions. More specifically the atmosphere during deposition can contain $N_2$ and depending on the quantity of it, compositions with y varying from 0 to 1 or even more than 1 can be obtained. The most commonly used sputtering and evaporation techniques to deposit $CrN_y$ employs an atmosphere composed of $N_2$ and Ar. Critical parameter to determine the resulting $CrN_y$ composition (i.e. the value of y) is the ratio between $N_2$ and Ar, or more properly the ratio between the flux of $N_2$ and total flux (sum of $N_2$ and Ar), $N_2/(N_2+Ar)$ ratio. The larger this ratio the larger the y value (Journal of Non-Crystalline Solids 218 (1997) 68-73).

It is therefore one object of the present invention to provide a coating and a method for depositing the coating on a substrate of a photolithographic mask that is electrically conductive, optically transparent and additionally has suitable mechanical properties and better adhesion.

SUMMARY OF THE INVENTION

In a first embodiment, the present invention is directed to a composition for a photolithographic mask comprising a substrate; and a coating deposited on a surface of the substrate, the coating comprising at least one electrical conducting layer comprising a thickness from about 5 nm to about 30 nm; and at least one metal nitride of the formula MNy, wherein M is a metal comprising Cr, Ti, Al or Si or combinations thereof, N is nitrogen, and y is greater than zero and less than 1. M can also be Mo, W, Zr, Hf, V, Nb, Ta; and instead of N, boron (B) or carbon (C) can also be used; and the upper limit of y can be extended to 2. In some embodiments, the at least one electrical conducting layer has an optical transmittance from about 5% to about 35% in the wavelength range of 300 nm to 1600 nm. In some embodiments, the at least one electrical conducting layer has a sheet resistance from about 70Ω/□ to about 200Ω/□. In other embodiments, the at least one electrical conducting layer comprises a metal oxynitride having the general formula MOxNy, wherein M, N and y are defined as above, O is oxygen, and x is greater than zero and less than 1. In other embodiments, the at least one electrical conducting layer has a thickness that varies less than ±5% across the at least one electrical conducting layer. In other embodiments, the at least one electrical conducting layer comprises a surface roughness of <0.6 nm route mean square across an area of up to 100 μm². In other embodiments, the substrate comprises fused silica, ZERODUR®, ULE® or CLEAR-CERAIVI®.

In a second embodiment, the present invention is a method of making a composition for a photolithographic mask comprising the steps of providing a substrate; and depositing a coating on the substrate, the coating comprising at least one electrical conducting layer having a thickness less than 50 nm, and at least one metal nitride of the formula MNy, wherein M is a metal comprising Cr, Ti, Al, Si or combinations thereof, N is nitrogen, and y is greater than zero and less than 1. In some embodiments, the coating is deposited on the substrate by physical vapor deposition. In other embodiments, the physical vapor deposition method comprises a reactive deposition. In other embodiments, the physical vapor deposition method occurs in a chamber having a pressure of from about 9.9×10−7 Torr to about 1×10−7 Torr. In other embodiments, the step of adjusting the temperature of the substrate from about 100° C. to about 150° C. In other embodiments, the coating is deposited onto the substrate comprising a thermal evaporation process. In other embodiments, the coating is deposited onto the substrate comprising a chemical vapor deposition.

In some embodiments, a method of the present invention further comprises providing a flow of argon gas and a flow of nitrogen gas to the composition; and adjusting the flow of argon gas and the flow nitrogen to vary the amount of nitrogen present in the metal nitride. In other embodiments, the total flow of argon and nitrogen gas is about 20 sccm. In other embodiments, the flow of argon gas is from about 11 sccm to about 19 sccm and the flow of nitrogen gas is about 1 sccm to about 9 sccm. In some embodiments, the method further comprises providing a flow of oxygen gas to the composition; and forming a metal oxynitrides having the formula MOxNy, wherein M, N and y are defined as above, O is oxygen, and x is greater than zero and less than 1.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

FIG. 3 depicts a table summarizing the result for the multilayer coatings described in FIG. 2. The column furthest to the right corresponds to the mechanical resistance of each coating. The larger the % increase in resistance reported, the lower the mechanical resistance of the coating.

DETAILED DESCRIPTION

Figure 1A:
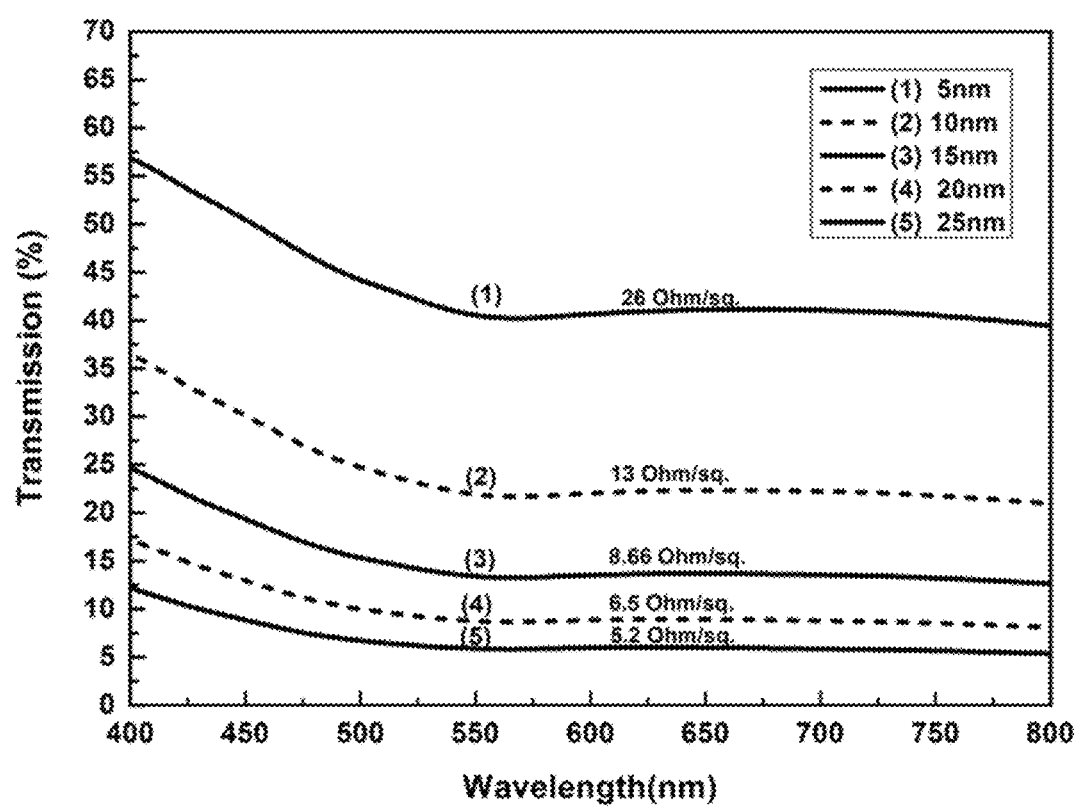
FIGS. 1a and 1b depict theoretical transmissions as a function of wavelength calculated for Cr and stoichiometric CrN films of different thicknesses on fused silica substrate. Due to variances in processing conditions including, but not limited to deposition, substrate surface quality, substrate surface treatment, film imperfections and boundary effects, the actual sheet resistance can be much larger than the theoretical values indicated in the figure.
Figure 1B:
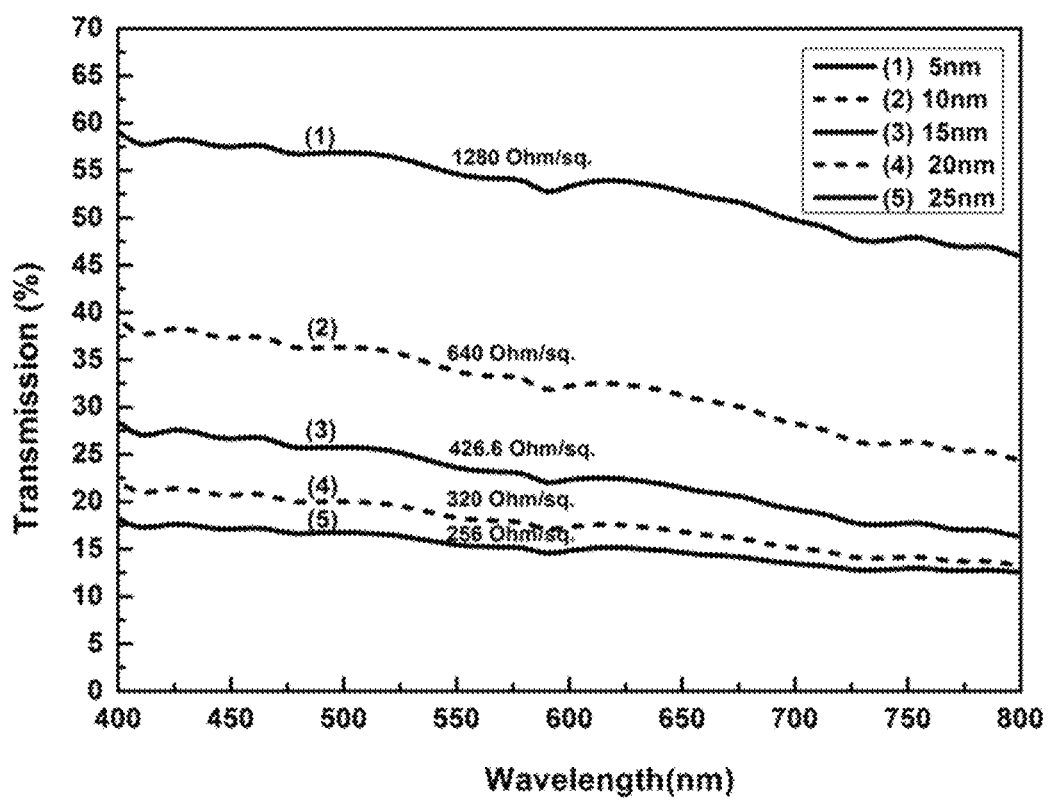

The invention aims at solving the technical problems posed above by providing a substrate for a photolithographic mask comprising a coating deposited on a rear side surface of the substrate, the coating comprising at least one electrically conducting layer, wherein the thickness of the conductive layer is from about 5 nm to about 25 nm.

The at least one layer comprises at least one metal nitride with a composition different from the stoichiometric one. For example $CrN_y$, wherein 0<y<1. In this way one can tune the trade-off between T and Rs beyond that achievable by simply changing the thickness of the stoichiometric metal nitride, for example CrN, and improve the mechanical resistance with respect to the structures containing the metal, for example Cr. Instead the nitride, or besides the nitride, the at least one layer can comprise as well at least one boride and/or at least one carbide.

Electrically conducting coatings having the defined thickness are also at least partially optically transparent. Additionally, inventive coatings fulfill specific mechanical requirements. They are mechanically resistant against delamination. The defined coatings are sufficiently thin as to reduce bending stress in the substrate of an EUV optical element. Furthermore, inventive coatings have a strong adhesion, hardness and elasticity against indentation. Thus, the coating does preferably not show a mechanical failure before a failure of the substrate of the optical EUV element. In case the coating releases particles during the operating of the EUV optical element, these particles are small enough in size and numbers so that they do not prevent the function of the EUV optical element.

Moreover, inventive coatings have a smooth surface. They do essentially not generate unwanted particles during the operation life-time of the EUV optical element. Therefore, mask blanks and/or EUV optical elements having a substrate with an inventive coating are well suited for being held with an electrostatic chuck. Furthermore, ultra-short laser pulses can transmit inventive coatings in a controlled manner.

In a further aspect of the present invention, the at least one layer comprises an optical transmittance of more than 5%, preferably more than 10% and most preferably more than 20% in the wavelength range of 300 nm-1600 nm. Without being bound to one particularly theory, a high transmittance leads to a low portion of absorbed optical intensity in the coating layer, and thus results in a low thermal load of the coating layer.

In a further aspect, the at least one layer according to the invention comprises a sheet resistance from about 70Ω/□ to about 200 Ω/□.

In the presently preferred application, the electrically conducting coating layer is applied to hold a EUV mask blank and/or an EUV optical element on an electrostatic chuck. Therefore, only currents due to an electrostatic induction are flowing within the coating layer. This means that the amount of current flowing in the coating layer is moderate.

In another aspect of the invention the metal nitride vary its composition along the thickness. For example in the case of $CrN_y$ that means y varies along the thickness. This can be achieved by combining discrete layers of different compositions, e.g. $CrN_y$ with different y, or by continuously tuning the composition, e.g. $CrN_y$ with gradual change of y. In some embodiments, y is larger than 0 and smaller than 1.

In another aspect of the invention nitrides of Cr, Ti, Al and more complex structures, including oxynitride, may be beneficial. For example of the type $CrN_y$, $TiN_y$, $AlN_y$, $CrSi_xN_y$, $TiSi_xN_y$, $AlSi_xN_y$, CrAlN, TiAlN, $CrO_xN_y$.

The feature of introducing non-stoichiometric composition for the coating combines the flexibility in the design of the coating, trade-off between T, Rs, and mechanical durability, with the possibility to take environmental consideration into account.

In still another aspect, the substrate comprises a material having a low thermal expansion coefficient, including, but not limited to fused silica.

For example, fused silica is a material having a low thermal expansion (LTE) coefficient. Other suitable LTE materials can be used as substrate materials as for example transparent dielectrics, glass materials and/or semiconductor materials. ZERODUR®, ULE® and CLEARCERAM® are product examples of materials having a low thermal expansion (LTE) coefficient. The application of LTE material for EUV substrates helps to fulfil the temperature stability requirements of EUV optical elements.

In still another aspect, a front surface of the substrate comprises a multilayer structure. According to a further aspect, a front surface comprises an absorbing layer forming pattern elements of an extreme ultraviolet photolithographic mask.

Due to the extremely short wavelength, EUV masks have to be plane within the range of about 1 nm. The defined coating opens the possibility to correct among other things planarity defects of completely fabricated EUV masks by introducing ultra-short laser pulses through the defined coating into the substrate of an EUV mask.

According to a further aspect, the at least one layer comprises an area of 148 mm×148 mm. In yet another aspect, the thickness of the at least one layer varies less than ±5%, preferably less than ±2% across the area of the at least one layer. In still a further aspect, a surface roughness of the at least one layer across an area of up to 100 μm² is ≤0.6 nm route mean square.

The defined coatings can be fabricated for small areas in the millimeter or even sub-millimeter range, but can also be deposited on large areas with a high constant quality across the overall area. A smooth surface of the coating enable a precise control of the optical intensity locally applied by ultra-short laser pulses into the substrate of an EUV mask blank and/or EUV optical element for defect compensation.

According to still another aspect, the substrate is a substrate for an extreme ultraviolet photolithographic mask. In yet a further aspect, the coating electro-statically chucks the extreme ultraviolet photolithographic mask during its operation and the at least one layer allows transmitting of ultra-short laser pulses through the coating into the substrate, wherein the ultra-short laser pulse having a focal point spot diameter of 1 μm and a maximum optical intensity of $10^{20}$ W/cm$^2$.

As already mentioned the rear side coatings of EUV substrates do not have to fulfil highest demands for the electrical conductivity. But the coatings have to withstand highest optical intensities without inducing any damage in the coating and/or in the substrate. Further, the coatings may not modify the optical beam in an uncontrolled way. This results in strict specifications for the thickness homogeneity and the surface roughness of the coating layer in order to guarantee predetermined specifications of the reflection and/ or of the absorption of ultra-short laser pulses.

According to a further aspect, a method for depositing a coating on a substrate of a photolithographic mask comprises (a) depositing at least one electrically conducting layer on the substrate, and (b) the layer containing at least one metal nitride with non-stoichiometric composition and different from a metal.

In another aspect, depositing the at least one layer comprises a physical vapor deposition method. According to a further aspect the physical vapor deposition method comprises a sputter deposition method. In still a further aspect, the physical vapor deposition method comprises a reactive deposition.

The deposition occurs in a high vacuum chamber having a pressure of about $9.9 \times 10^{-7}$ to about $1 \times 10^{-7}$ Torr. This allows precisely controlling the composition and thickness of the deposited layer. Further, the temperature of the substrate in the vacuum chamber is adjusted from about 100° C. to 150° C. prior to the deposition process in order to secure a high quality of the deposited layer.

According to a further aspect, depositing the at least one layer comprises a thermal evaporation of a material of the at least one layer. In still another aspect, depositing the at least one layer comprises an evaporation of the material of the at least one layer by an electron beam. In a further aspect comprises the step of combining the thermal evaporation of the material or the evaporation by an electron beam with an ion assisted deposition. In yet a further aspect, depositing the least one layer comprises a chemical vapor deposition. According to another aspect, depositing the at least one layer comprises a molecular beam deposition.

Another aspect further comprises the step of forming a metal nitride by using a controlled atmosphere containing nitrogen (N$_2$) and another gas when sputtering the metal. The other gas can be Argon so that the concentration of N$_2$ in the forming metal nitride can be vary by varying the ration between nitrogen and argon gases.

Another aspect of the invention further includes the possibility of forming oxynitrides by adding oxygen to the atmosphere.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

Examples

In the following, the present invention will now be described in more detail hereinafter with reference to the accompanying figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

A double side optically polished UV fused silica glass with 1 mm thickness and 1 inch square was used as substrate. Before deposition of the coating, the substrates were cleaned in acetone followed by ethanol in ultrasonic bath, each process lasting 10 min. The substrate was then rinsed in DI water and dried with nitrogen gas followed by argon plasma cleaning for 15 min inside the sputtering machine. 20 sccm of Argon gas with 8 mT pressure and 40 W BIAS power was used for plasma cleaning.

The thin film coating was prepared by magnetron sputtering without breaking the vacuum. The sputtering chamber was initially evacuated to a base pressure of $10^{-7}$ Torr. The substrate to target distance was maintained at 40 cm. Cr was deposited in 20 sccm pure Ar atmosphere with 300 W power, 2 mT pressure and 150° C. temperature. While CrN was deposited in different combination of Ar and N$_2$ atmosphere with 300 W power, 2 mT pressure and 150° C. temperature. The total flow of Argon and nitrogen kept constant at 20 sccm.

Figure 2:
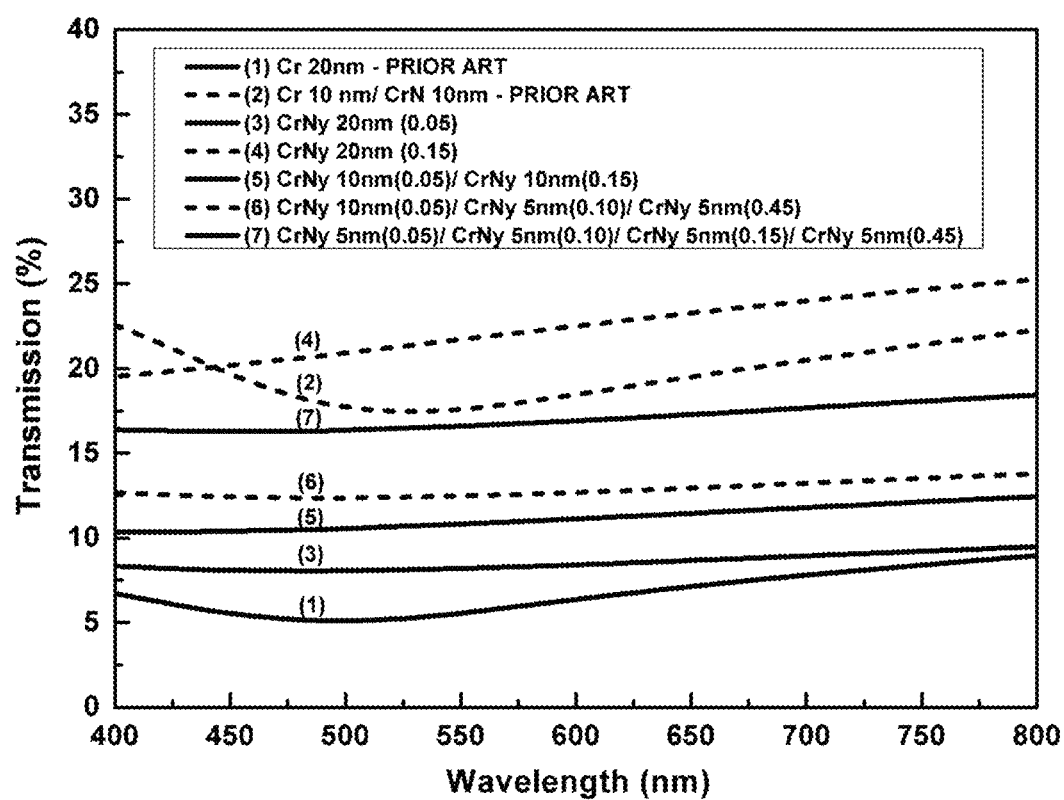
FIG. 2 depicts the transmission of Cr, Cr+CrN and proposed coating containing at least a $CrN_y$ layer, with $N_2$ content between Cr and CrN. The total thickness of the coatings is kept constant at 20 nm and the coatings are deposited using sputtering of Cr in a controlled atmosphere of Ar and $N_2$. The composition, ratio between Cr and $N_2$, is varied by varying the ratio between Ar and $N_2$ gases in the controlled atmosphere. Cr corresponds to $N_2/(N_2+Ar)$ ratio of 0, CrN corresponds to $N_2/(N_2+Ar)$ ratio of 1, while $CrN_y$ corresponds to $N_2/(N_2+Ar)$ ratio in between 0 and 1. The $N_2/(N_2+Ar)$ ratio for each $CrN_y$ layer is indicated in bracket, after the value of the thickness in nm.

As shown in FIG. 2, transmission of 20 nm thick multi-layer coating with CrNy with varying composition of Ar and N$_2$. The bottom curve in FIG. 2 corresponds to a pure Cr 20 nm film made from Ar-20 sccm and N$_2$-0 sccm. The CrN layer corresponds to Ar-0 sccm and N$_2$-20 sccm, while the intermediate CrNy compositions are obtained using Ar between 11-19 sccm and N$_2$ is in between 9-1 sccm.

As shown in FIG. 3, the optical, electrical and mechanical results for the coatings of manufactured above are given. Compared to pure Cr film coatings and CrN film coatings, the proposed multilayer coatings (CrN$_y$) achieve superior trade-off between T and Rs, while ensuring the lowest values of change after mechanical test (% value in the last column).

The electrical properties of the films were measured using four point probe method with cascade Microtech 44/7 S 2749 probe system connected to a Keithley 2001 multimeter. Typically 6 measurements were performed at different positions on the film and mean values were used to calculate the Rs. The optical transmission of the film is measured with Perkin Elmer lamda 950 spectrophotometer.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A composition for a photolithographic mask comprising:
   a. a substrate; and
   b. a coating deposited on a surface of the substrate, the coating comprising at least one electrical conducting layer comprising:
      i. a thickness from about 5 nm to about 30 nm; and
      ii. at least one compound selected from the following group:
         a metal boride of the formula MBz, wherein M is a metal comprising Cr, Ti, Zr, Hf, V, Nb, Ta, Mo, W, Al, Si or combinations thereof, B is boron, and z is greater than zero and less than or equal to 2;
         a metal carbide of the formula MCz, wherein M is a metal comprising Cr, Ti, Zr, Hf, V, Nb, Ta, Mo, W, Al, Si or combinations thereof, C is carbon, and z is greater than zero and less than or equal to 2; and
         a metal nitride of the formula $MN_y$, wherein M is a metal comprising Cr, Ti, Zr, Hf, V, Nb, Ta, Mo, W, Al, Si or combinations thereof, N is nitrogen, and y is greater than zero and less than 1, and at least one compound selected from the following group:
            a metal boride of the formula MBz, wherein M is a metal comprising Cr, Ti, Zr, Hf, V, Nb, Ta, Mo, W, Al, Si or combinations thereof, B is boron, and z is greater than zero and less than or equal to 2;
            a metal carbide of the formula MCz, wherein M is a metal comprising Cr, Ti, Zr, Hf, V, Nb, Ta, Mo, W, Al, Si or combinations thereof, C is carbon, and z is greater than zero and less than or equal to 2.

2. The composition of claim 1, wherein the at least one electrical conducting layer has an optical transmittance from about 5% to about 35% in the wavelength range of 300 nm to 1600 nm.

3. The composition of claim 1, wherein the at least one electrical conducting layer has a sheet resistance from about 70Ω/□ to about 200 Ω/□.

4. The composition of claim 1, wherein the at least one electrical conducting layer comprises a metal oxynitride having the general formula $MO_xN_y$, wherein M, N and y are defined as above, O is oxygen, and x is greater than zero and less than 1.

5. The composition of claim 1, wherein the at least one electrical conducting layer has a thickness that varies about ±5% across the at least one electrical conducting layer.

6. The composition of claim 1, wherein the at least one electrical conducting layer comprises a surface roughness of <0.6 nm route mean square across an area of up to 100 μm².

7. The composition of claim 1, wherein the substrate comprises fused silica, ZERODUR®, ULE® or CLEAR-CERAM®.

8. A method of making a composition for a photolithographic mask comprising the steps of:
   a. providing a substrate; and
   b. depositing a coating on the substrate, the coating comprising:
      i. at least one electrical conducting layer having a thickness from about 5 nm to about 30 nm, and
      ii. at least one compound selected from the following group:
         a metal boride of the formula MBz, wherein M is a metal comprising Cr, Ti, Zr, Hf, V, Nb, Ta, Mo, W, Al, Si or combinations thereof, B is boron, and z is greater than zero and less than or equal to 2;
         a metal carbide of the formula MCz, wherein M is a metal comprising Cr, Ti, Zr, Hf, V, Nb, Ta, Mo, W, Al, Si or combinations thereof, C is carbon, and z is greater than zero and less than or equal to 2; and
         a metal nitride of the formula $MN_y$, wherein M is a metal comprising Cr, Ti, Zr, Hf, V, Nb, Ta, Mo, W, Al, Si or combinations thereof, N is nitrogen, and y is greater than zero and less than 1, and at least one compound selected from the following group:
            a metal boride of the formula MBz, wherein M is a metal comprising Cr, Ti, Zr, Hf, V, Nb, Ta, Mo, W, Al, Si or combinations thereof, B is boron, and z is greater than zero and less than or equal to 2;
            a metal carbide of the formula MCz, wherein M is a metal comprising Cr, Ti, Zr, Hf, V, Nb, Ta, Mo, W, Al, Si or combinations thereof, C is carbon, and z is greater than zero and less than or equal to 2.

9. The method of claim 8, wherein the coating is deposited on the substrate by physical vapor deposition.

10. The method of claim 9, wherein the physical vapor deposition method comprises a reactive deposition.

11. The method of claim 9, wherein the physical vapor deposition method occurs in a chamber having a pressure of from about $9.9 \times 10^{-7}$ Torr to about $1 \times 10^{-7}$ Torr.

12. The method of claim 8, further comprising the step of adjusting the temperature of the substrate from about 100° C. to about 150° C.

13. The method of claim 8, wherein the coating is deposited onto the substrate comprising a thermal evaporation process.

14. The method of claim 8, wherein the coating is deposited onto the substrate comprising a chemical vapor deposition.

15. The method of claim 8, further comprising providing a flow of argon gas and a flow of nitrogen gas to the composition; and adjusting the flow of argon gas and the flow nitrogen to vary the amount of nitrogen present in the metal nitride.

16. The method of claim 15, wherein the total flow of argon and nitrogen gas is about 20 sccm.

17. The method of claim 15, wherein the flow of argon gas is from about 11 sccm to about 19 sccm and the flow of nitrogen gas is about 1 sccm to about 9 sccm.

18. The method of claim 15, further comprising providing a flow of oxygen gas to the composition; and forming a metal oxynitrides having the formula MOxNy, wherein M, N and y are defined as above, O is oxygen, and x is greater than zero and less than 1.

* * * * *